United States Patent
Naka et al.

(10) Patent No.: US 9,966,515 B2
(45) Date of Patent: May 8, 2018

(54) LIGHT EMITTING DEVICE AND METHOD OF MANUFACTURING THE LIGHT EMITTING DEVICE

(71) Applicant: NICHIA CORPORATION, Anan-shi, Tokushima (JP)

(72) Inventors: Ryoji Naka, Tokushima (JP); Atsushi Bando, Itano-gun (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days. days.

(21) Appl. No.: 15/388,568

(22) Filed: Dec. 22, 2016

(65) Prior Publication Data

US 2017/0186927 A1   Jun. 29, 2017

(30) Foreign Application Priority Data

Dec. 26, 2015   (JP) ................................ 2015-255502
Nov. 22, 2016   (JP) ................................ 2016-226813

(51) Int. Cl.
| | |
|---|---|
| H01L 33/00 | (2010.01) |
| H01L 33/60 | (2010.01) |
| H01L 33/48 | (2010.01) |
| H01L 33/62 | (2010.01) |
| H01L 33/32 | (2010.01) |

(52) U.S. Cl.
CPC .......... *H01L 33/60* (2013.01); *H01L 33/0095* (2013.01); *H01L 33/32* (2013.01); *H01L 33/486* (2013.01); *H01L 33/62* (2013.01); *H01L 2933/0058* (2013.01); *H01L 2933/0066* (2013.01)

(58) Field of Classification Search
CPC .......... H01L 33/06; H01L 33/48; H01L 33/52; H01L 33/54; H01L 33/44; H01L 33/60; H01L 33/62; H01L 33/483; H01L 33/486; H01L 33/507
USPC ................................................... 257/97–103
See application file for complete search history.

(56) References Cited

U.S. PATENT DOCUMENTS

| | | | |
|---|---|---|---|
| 2009/0166657 | A1 | 7/2009 | Yamada et al. |
| 2012/0025243 | A1* | 2/2012 | Lin ........................ H01L 33/54 |
| | | | 257/98 |

(Continued)

FOREIGN PATENT DOCUMENTS

| | | |
|---|---|---|
| JP | 2005-136378 A | 5/2005 |
| JP | 2009-164157 A | 7/2009 |

(Continued)

*Primary Examiner* — Brook Kebede
(74) *Attorney, Agent, or Firm* — Foley & Lardner LLP

(57) ABSTRACT

A method of manufacturing a plurality of light emitting devices includes providing a collective substrate including a plurality of packages, each of the packages including: a recess defined by lateral surfaces and a bottom surface, a first electrode and a second electrode that are disposed at the bottom surface of the recess, and a light-reflective first resin member surrounding an element-mounting region of the bottom surface of the recess, the first resin member having an upper surface located at a position higher than the element-mounting region; mounting a light emitting element in the element-mounting region; forming a light-reflective second resin member having a light reflective surface; and singulating the collective substrate to obtain the plurality of light emitting devices.

12 Claims, 11 Drawing Sheets

(56) References Cited

U.S. PATENT DOCUMENTS

| | | | |
|---|---|---|---|
| 2012/0104452 A1 | 5/2012 | Miyoshi et al. | |
| 2012/0326193 A1* | 12/2012 | Park | H01L 33/52 257/98 |
| 2014/0085884 A1 | 3/2014 | Horio et al. | |
| 2015/0124455 A1* | 5/2015 | Tamura | F21V 13/08 362/293 |

FOREIGN PATENT DOCUMENTS

| | | |
|---|---|---|
| JP | 2012-099544 A | 5/2012 |
| JP | 2013-115116 A | 6/2013 |
| JP | 2013-131519 A | 7/2013 |
| JP | 2014-067846 A | 4/2014 |
| JP | 2014-158011 A | 8/2014 |
| JP | 2015-153856 A | 8/2015 |
| WO | WO-2009/075530 A2 | 6/2009 |

* cited by examiner

LIGHT EMITTING DEVICE AND METHOD OF MANUFACTURING THE LIGHT EMITTING DEVICE

CROSS-REFERENCE TO RELATED PATENT APPLICATIONS

This application claims priority to Japanese Patent Application No. 2015-255502 filed on Dec. 26, 2015, and Japanese Patent Application No. 2016-226813 filed on Nov. 22, 2016, the disclosures of which are hereby incorporated herein by reference in their entireties.

BACKGROUND

The present disclosure relates to a light emitting device and a method of manufacturing the light emitting device.

A light emitting device including a light emitting element mounted on a substrate, a light reflecting layer arranged on the substrate outside of a mounting region of the light emitting element, and a partition wall surrounding the mounting region of the light emitting element is known (e.g., Japanese Unexamined Patent Publication No. 2014-158011).

SUMMARY

In a light emitting device as described in Japanese unexamined patent publication No. 2014-158011, the light reflecting layer and the partition wall, each of which is made of a resin, may be expanded and separated from each other due to heat of curing of a resin in the manufacturing and heat generated from the light emitting element.

According to certain embodiments of the present disclosure, it is an object to provide a method of manufacturing a light emitting device in which separation between resin members is reduced. Further, according to certain embodiments of the present disclosure, it is an object to provide a light emitting device having high light extraction efficiency.

A method of manufacturing a plurality of light emitting devices according to one embodiment includes: providing a collective substrate including a plurality of packages, each of the plurality of packages including a recess defined by lateral surfaces and a bottom surface, a first electrode and a second electrode that are disposed at the bottom surface of the recess, and a light-reflective first resin member surrounding an element-mounting region of the bottom surface of the recess, the first resin member having an upper surface located at a portion higher than the element-mounting region; mounting a light emitting element in the element-mounting region; forming a light-reflective second resin member having a light reflective surface, in which the light-reflective second resin member is disposed at least between the lateral surfaces of the recess and the first resin member, the second resin member covers at least a portion of an upper surface of the first resin member and is spaced apart from lateral surfaces of the light emitting element, the light reflective surface has a height that is smallest at an end portion of the light reflective surface that is located at the first resin member; and singulating the collective substrate to obtain the plurality of light emitting devices.

A light emitting device according to certain embodiments includes: a package including: a recess defined by lateral surfaces and a bottom surface, and an electrode portion including a plurality of electrodes arranged at a bottom surface of the recess, the bottom surface of the recess including an element-mounting region; a light emitting element mounted in the element-mounting region; a light-reflective first resin member having an upper surface located at a position higher than the element-mounting region; a light-reflective second resin member having a light reflective surface, in which the second resin member is disposed at least between the lateral surfaces of the recess and the first resin member, the second resin member covers at least a portion of an upper surface of the first resin member and is spaced apart from lateral surfaces of the light emitting element, and the light reflective surface has a height that is smallest at an end portion of the light reflective surface that is located at the first resin member.

According to certain embodiments of the present disclosure, a method of manufacturing a light emitting device in which separation between resin members is reduced can be obtained.

According to certain embodiments of the present disclosure, a light emitting device having high light extraction efficiency can be provided.

DETAILED DESCRIPTION

Certain embodiments of the present invention will be described below with reference to the drawings. The embodiments described below are intended as illustrative to give a concrete form to technical ideas of the present invention, and thus the technical scope of the invention shall not be limited to those described below. Configurations described in one embodiment can also be applied in other embodiments unless specifically indicated. In the description below, when appropriate, terms which indicate specific directions or locations (for example, "up", "down", "right", "left" and other terms expressing those) may be applied, but those terms are used for easy understanding of the disclosure with reference to the accompanying drawings, and thus the technical scope of the disclosure shall not be limited by the meaning of those terms.

The sizes and the arrangement relationships of the members in each of drawings are occasionally shown exaggerated for ease of explanation. The same numerals in different drawings indicate the same or similar portions or members.

In the embodiments described below, terms such as "collective substrate" and "lead frame with a plurality of resin-molded bodies" may refer to both before and after providing members such as light emitting elements, wires, and/or resin members.

Figure 1:
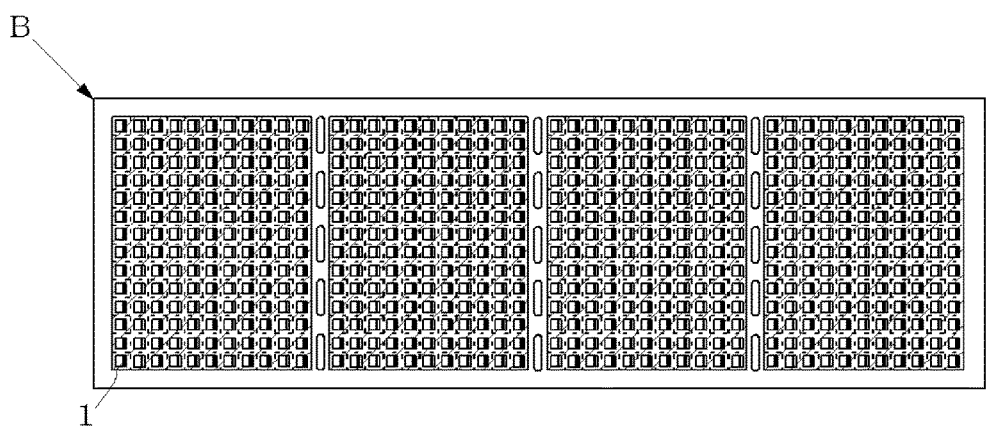
FIG. 1 is a schematic top view showing a collective substrate B according to various embodiments of the present disclosure.
Figure 2A:
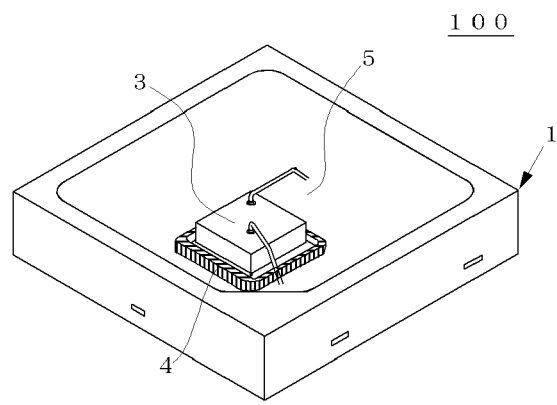
FIG. 2A is a schematic perspective view of a light emitting device according to various embodiments of the present disclosure.
Figure 2B:
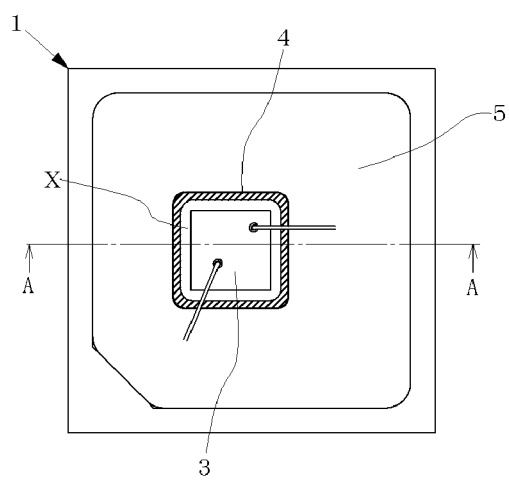
FIG. 2B is a schematic top view of a light emitting device shown in FIG. 2A.
Figure 2C:
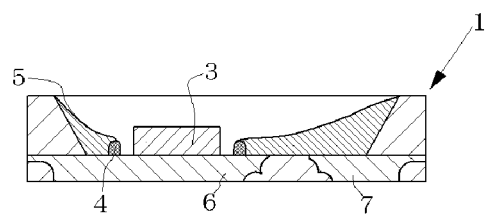
FIG. 2C is a schematic cross sectional view taken along line A-A in FIG. 2B.

A method of manufacturing a plurality of light emitting devices 100 according to one embodiment includes providing a collective substrate B including a plurality of packages 1 each including a light-reflective first resin member 4, mounting a light emitting element 3 on each of the plurality of packages 1, disposing a light-reflective second resin member 5 on each of the plurality of packages 1, and singulating the collective substrate B to obtain the plurality of light emitting devices 100. FIG. 1 is a schematic top view showing the collective substrate B according to various embodiments of the present disclosure. FIG. 2A is a schematic perspective view showing the light emitting device 100 according to various embodiments of the present disclosure. FIG. 2B is a schematic top view showing the light emitting device 100 shown in FIG. 2A. FIG. 2C is a schematic cross sectional view taken along line A-A in FIG. 2B.

1. Providing Collective Substrate B

As shown in FIG. 1, the collective substrate B includes the plurality of packages 1 each including a recess 2 defined by lateral surfaces and the bottom surface, and the plurality of packages 1 are integrally formed. FIG. 1 shows the collective substrate B before provided with members such as the light emitting elements 3 and the first resin members 4. Next, the package 1 will be described below with reference to FIGS. 2A to 2C. The bottom surface of the recess 2 includes at least a surface of each of a first electrode 6 and a second electrode 7, and a region for mounting the light emitting element 3 (hereinafter may be referred to as an "element-mounting region X"). The element-mounting region X is demarcated by a light-reflective first resin member 4 to be described further below. A plurality of the element-mounting regions X may be provided on the bottom surface of the recess 2.

The element-mounting region X has a shape corresponding to an outermost periphery of the light emitting element 3 to be arranged thereon, or a shape corresponding to a planar shape of the light emitting element 3. That is, the element-mounting region X has an outer shape corresponding to, substantially corresponding to (e.g., an area ratio within 110%), or larger than the outer peripheral shape of the light emitting element 3 to be mounted thereon.

The number of light emitting element(s) 3 arranged on one element-mounting region X may be one, or may be two or more. In the case of arranging two or more light emitting elements 3 on an element-mounting region X, the overall outer shape of the plurality of the light emitting elements 3 to be arranged can be regarded as the outer peripheral shape of the light emitting elements 3.

The planar dimension of the element-mounting region X can be determined as appropriate based on the planar area, the number, the arrangement or the like of the light emitting elements 3 to be mounted thereon. When a single light emitting element 3 is employed, the planar dimension of the element-mounting region X is preferably in a range of 1.2 times to 2 times, more preferably in a range of 1.5 times to 1.8 times as large as the planar dimension of the light emitting element 3.

For the package 1, for example, a resin package including a resin molded body having one or more metal plates made of, for example, iron, copper, silver, Kovar®, and/or nickel, etc., embedded therein, or an insulating substrate made of a ceramic or the like including wirings can be used. The package 1 includes at least an electrode portion that includes a first electrode 6 and a second electrode 7, and may further include a portion for heat dissipation.

When the package 1 is a resin package, a resin-molded body and a plurality of electrodes are formed as a single body, in which the plurality of electrodes are arranged in the bottom surface of the recess 2.

On the bottom surface of the recess 2 of the package 1, the light-reflective first resin member 4 is formed to surround the element-mounting region X. As described below, the first resin member 4 may be formed in a step different from a step of forming the package 1, or may be formed simultaneously with the package 1 in the same step. The first resin member 4 is formed to surround the light emitting element 3, and has an upper surface located higher than the element-mounting region X. With this arrangement, the first resin member 4 can prevent the light-reflective second resin member 5 described below from extending to lateral surfaces of the light emitting element 3 and covering the lateral surfaces of the light emitting element 3. Further, with the first resin member 4 arranged to surround a portion near the light emitting element 3, an inclined surface of the second resin member 5 can be inclined more upward, so that light emitted from the light emitting element 3 can be efficiently extracted upward.

The first resin member 4 is disposed inner side of the lateral surfaces of the recess 2 of the package 1 and functions as a wall for preventing entry of the second resin member 5 described below (i.e., stopping member). For this reason, the first resin member 4 is disposed between a region for disposing the second resin member 5 and the light emitting element 3. For example, when the second resin member 5 is disposed surrounding the entire periphery of the light emitting element 3, the first resin member 4 is disposed to surround the entire periphery of the light emitting element 3.

Figure 3A:
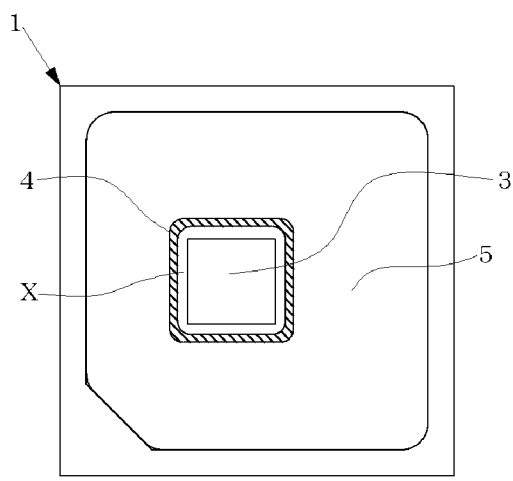
FIG. 3A is a schematic top view showing a first resin member surrounding a light emitting element according to various embodiments of the present disclosure.
Figure 3B:
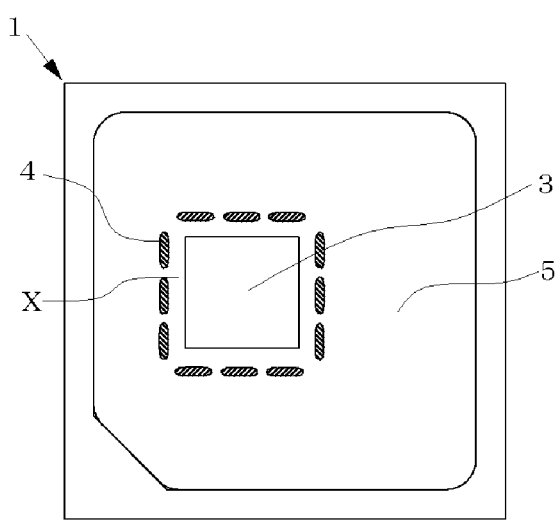
FIG. 3B is a schematic top view showing a first resin member surrounding a light emitting element according to various embodiments of the present disclosure.

In this case, the first resin member 4 may be formed in a continuous closed shape as shown in FIG. 3A, or may be formed in a shape made of a plurality of separate portions as shown in FIG. 3B. In either the case, the first resin member 4 is arranged surrounding the entire periphery of, that is, in regions corresponding to all peripheral sides of the light emitting element 3 in a plan view.

Figure 3C:
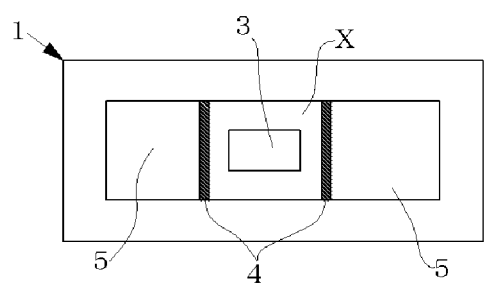
FIG. 3C is a schematic top view showing a first resin member surrounding a light emitting element according to various embodiments of the present disclosure.

Alternatively, as shown in FIG. 3C, when the second resin member 5 is not disposed surrounding the entire periphery of the light emitting element 3, but is disposed partially surrounding the periphery of the light emitting element 3, for example, when the first resin member 4 is disposed corresponding to one to three peripheral sides of the light emitting element 3 having a quadrilateral shape in a plan view, the first resin member 4 is arranged corresponding to the one to three peripheral sides of the light emitting elements 3. In other words, the first resin member 4 is absent in one to three regions of four regions corresponding to the four peripheral sides of the quadrilateral light emitting element 3 in a plan view. The first resin members 4 that does not surround the entire periphery of the light emitting element 3 may have a shape such as a linear shape, a curved shape, or combination of these shapes. Further, the first resin members 4 that does not surround the entire periphery of the light emitting element 3 may have a portion being in contact with one or more of the lateral surfaces of the recess 2.

As described above, the first resin member 4 may be arranged either surrounding the entire periphery or a portion of the periphery of the light emitting element 3, both of which are referred to as "surrounding the light emitting element" in the present disclosure.

The first resin member 4 may be disposed by using any appropriate method. In the description below, a method of forming the first resin member 4 by drawing a resin (which may be referred to as a "resin drawing method") and a method of forming the first resin member 4 using a mold will be illustrated.

For the forming of the first resin member 4, a resin drawing method may be used.

In the resin drawing method, a syringe (i.e., an injector) in which a predetermined resin is held in a molten state is provided, and while discharging the molten resin from a needle (i.e., an injection needle), which has a through-hole and is attached to a tip portion of the syringe, by pushing a piston into inside of the syringe, the syringe is transferred to arrange the molten resin so that the molten resin surrounds the periphery of the light emitting element 3 in a plan view when viewed from a direction perpendicular to a main surface of the substrate. After that, the molten resin disposed on the bottom surface of the recess 2 of the package 1 is cured by, for example, heating, irradiating ultraviolet light, or the like, so that the first resin member 4 can be obtained.

For the first resin member 4, any appropriate resin that can be maintained in a molten state and also can be cured when needed can be employed. For example, for a base material of the molten resin, a thermosetting resin, a thermoplastic resin, etc., may be used. Examples of preferable resins include a silicone-based resin, a phenol resin, a BT resin, a PPA resin, and an epoxy-based resin. Also, a reflecting member (for example, titanium oxide, aluminum oxide, zinc oxide, magnesium oxide) or the like, which barely absorbs light from the light emitting element 3 and has a large difference in refractive index from a resin serving as the base material, may be contained in such resin serving as the base material as described above, so that light can be efficiently reflected.

A height and a width of the first resin member 4 can each be a desired value by adjusting an amount of the resin discharged from the needle (e.g., an amount of a resin per a distance of transfer of a syringe), characteristics of the molten resin such as the viscosity, number of application from the syringe, etc.

The first resin member 4 can have a height high enough to stop the entry of a resin to be the second resin member 5. A top of the first resin member 4 is preferably located lower than an active layer of the light emitting element 3. With this arrangement, light emitted from the active layer of the light emitting element 3 can be prevented from being blocked by the first resin member 4, so that light extraction efficiency of the light emitting device can be increased. For this reason, the smaller the height of the first resin member 4 is, the more preferable. Meanwhile, the width of the first resin member 4 is preferably greater than the height of the first resin member 4. As described above, with a relatively great width of the first resin member 4, an area in which the first resin member 4 and the second resin member 5 are adhered can be increased, so that a separation between the first resin 4 and the second resin 5 can be further prevented. For example, the first resin member 4 preferably has a height in a range of 40 μm to 60 μm and a width in a range of 50 μm to 100 μm. A distance between the first resin member 4 and each of the lateral surfaces of the light emitting element 3 is preferably in a range of 50 μm to 400 μm.

In order for the first resin member 4 to have a flat upper surface, an upper surface of the molten resin may be flattened using a jig such as a blade after arranging the molten resin on the bottom surface of the recess 2 with a syringe and before curing the molten resin.

The first resin member 4 may also be obtained by pushing a flat plate onto a surface of the molten resin arranged on the bottom surface of the recess 2 so that the upper surface of the molten resin is held and a lateral surface of the molten resin is released, curing the molten resin, and then removing the flat plate.

The viscosity of the first resin member 4 before curing is preferably higher than the viscosity of the second resin member 5 before curing. With this arrangement, in the case in which the second resin member 5 is formed by potting or the like, the effect of the first resin member 4 to stop the second resin member 5 can be further enhanced. Further, with a relatively high viscosity of the first resin member 4, the first resin member 4 of any appropriate shape (e.g., a shape with a narrow width or a great height) can be formed more easily.

Other methods of forming the first resin 4 includes simultaneously forming the first resin member 4 and the collective substrate B by using a mold in the forming of the collective substrate B including a plurality of resin packages. This method is described below using FIGS. 4A to 4C.

Figure 4A:
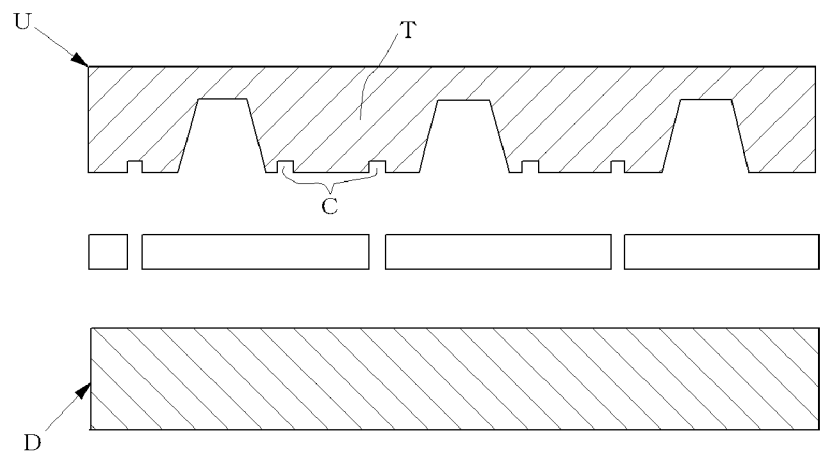
FIG. 4A is a schematic cross-sectional view illustrating a method of manufacturing a light emitting device according to one embodiment according to various embodiments of the present disclosure.

First, a lead frame is disposed in a mold assembly including an upper mold U and a lower mold D as described in FIG. 4A. The upper mold U includes a planar main body, outer wall portions formed in a frame-like shape at the peripheral portions of the main body, a plurality of protruding portions T protruding from the main body, small recesses C formed in the protruding portions T, and a plurality of injection ports penetrating one of the outer wall portions in a lateral direction. The small recesses C formed in the protruding portions correspond to the first resin members 4 that will be formed by injecting a resin into the mold cavity in a later step. The lower mold D is a planar body having a predetermined thickness and having a substantially flat surface. The lower mold D is configured to form a cavity that include the small recesses by being brought into contact with the upper mold U.

Figure 4B:
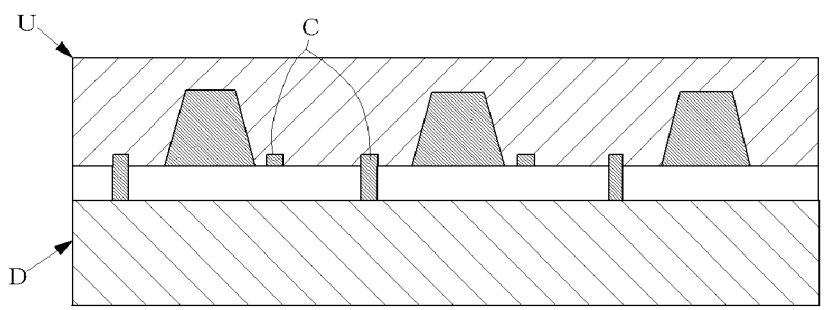
FIG. 4B is a schematic cross-sectional view illustrating a method of manufacturing a light emitting device according to various embodiments of the present disclosure.

Next, as illustrated in FIG. 4B, a resin containing a light-reflecting material is injected into the space including the small recesses C between the upper mold U and the lower mold D of the mold assembly. Then, preferably, pre-curing is performed by heating at a predetermined temperature inside the mold assembly, and subsequently discharging the pre-cured molding from the mold assembly, full-curing is performed by heating at a higher temperature than that in the pre-curing.

Figure 4C:
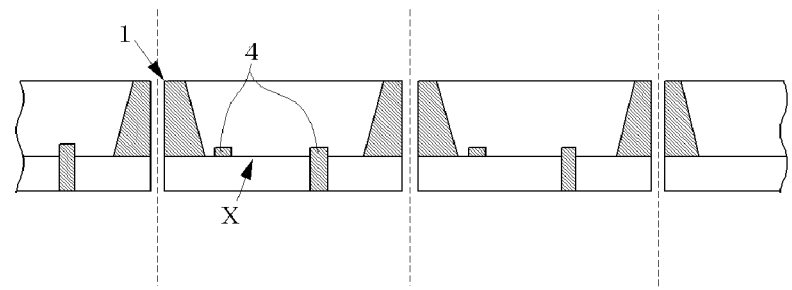
FIG. 4C is a schematic cross-sectional view illustrating a method of manufacturing a light emitting device according to various embodiments of the present disclosure.

Subsequently, as illustrated in FIG. 4C, the lead frame with a resin-molded body, which is thus formed, is cut so as to obtain each light emitting device. In FIG. 4C, illustration of members such as the light emitting element 3, wires, and the second resin member 5 are omitted for simplification.

The step of forming the collective substrate B is described above, but a commercially available collective substrate B may be provided.

2. Disposing the Light Emitting Element 3

On the bottom surface of the recess 2 of the package 1, the light emitting element 3 is mounted in the element-mounting region X demarcated by the first resin member 4. The light emitting element 3 is electrically connected with the first electrode 6 and the second electrode 7 via wires or the like. The number of the light emitting element 3 arranged on one element-mounting region X may be one, or may be plural.

For the light emitting element 3, a semiconductor light emitting element such as a light emitting diode element can be employed. The light emitting element 3 includes an element structure made of a various semiconductors and positive and negative electrodes. In particular, a nitride semiconductor $(In_XAl_YGa_{1-X-Y}N, 0 \leq X, 0 \leq Y, X+Y \leq 1)$ that can emit light in a range of the ultraviolet region to the visible light region may be preferably employed for the light emitting element 3. In the case in which the positive and negative electrodes of the light emitting element 3 are disposed on the same surface side of the light emitting element 3, the electrodes of the light emitting element 3 and the first electrode 6 and the second electrode 7 of the package 1 are electrically connected by wires, respectively, or each of the electrodes of the light emitting element 3 and the first electrode 6 and the second electrode 7 are arranged to face each other, respectively, and connected via conductive bonding members. Examples of such a conductive bonding member include tin-bismuth-based solder, tin-copper-based solder, tin-silver-based solder, gold-tin-based solder and the like (more specifically, alloys containing silver, copper and tin as main components, alloys containing copper and tin as main components, alloys containing bismuth and tin as main components, and the like), eutectic alloys (e.g., alloys containing gold and tin as main components, alloys containing gold and silicon as main components, alloys containing gold and germanium as main components, and the like), conductive pastes of silver, gold, palladium and the like, bumps, anisotropic conductive materials, and brazing materials such as low-melting-point metals. In the case in which a plurality of light emitting elements 3 are mounted in one package 1, the plurality of the light emitting elements 3 are connected to each other via wires in series or in parallel. In one package 1, for example, three light emitting elements 3 configured to emit, blue light, green light, and red light, respectively, may be mounted. For the light emitting element 3, a light emitting element in which a substrate that is not a growth substrate is bonded may also be used.

3. Forming Light-Reflective Second Resin Member 5

The second resin member 5 includes a light reflective surface, and the light reflective surface is formed between the lateral surfaces of the recess 2 and the first resin member 4. The second resin member 5 serves to direct light emitted from the light emitting element 3 toward an opening of the recess 2. The second resin member 5 may for example, for example, be formed to be entirely continuous between the lateral surfaces of the recess 2 and the first resin member 4, or may be formed to be interrupted as shown in FIG. 3C. A light emitting device shown in FIG. 3C includes two first resin members 4 and two second resin members 5. More specifically, the light emitting device shown in FIG. 3C has a substantially quadrangular outer shape having a longitudinal direction and a short-side direction perpendicular to the longitudinal direction in a top view. Further, the two first resin members 4 extends in the short-side direction and interpose two lateral surfaces of the light emitting element 3 therebetween. The two first resin members 4 are arranged near the light emitting element 3 spaced apart from the lateral surfaces of the light emitting element 3, respectively. Two second resin members 5 are disposed between each of the lateral surfaces at the longitudinal ends of the recess and its corresponding first resin member 4. In such light emitting device, an amount of resin used for each of the first resin member 4 and the second resin member 5 can be reduced, so that the light emitting device can be less-expensive. While a light emitting device with a substantially rectangular outer shape in a top view is illustrated as an example in the description above, the light emitting device may have any appropriate outer shape. For example, a light emitting device with a substantially square shape in a top view can have configurations as described above.

Figure 5:
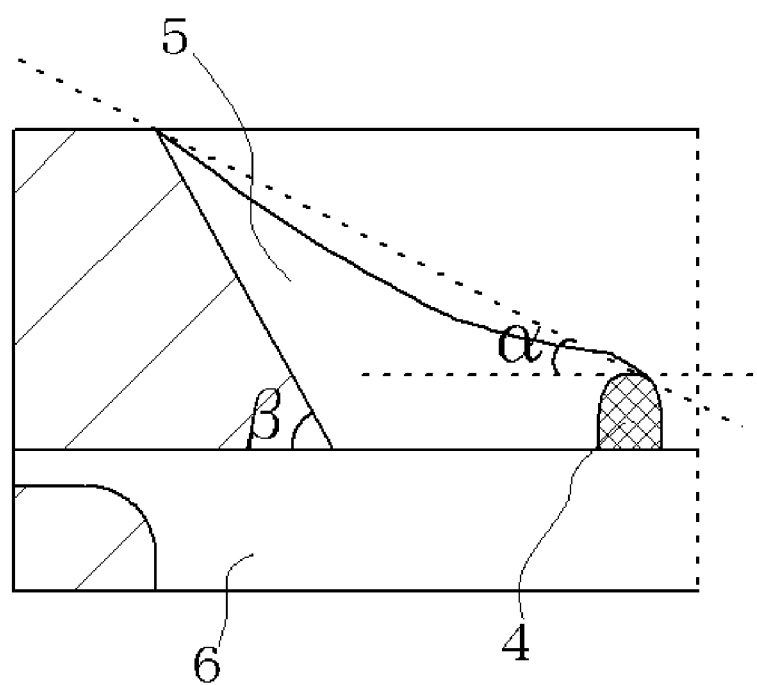
FIG. 5 is a schematic cross-sectional view showing a shape of a second resin member in a light emitting device according to various embodiments of the present disclosure.

As shown in FIG. 5, a slope of the inclined surface (i.e., light reflective surface) of the second resin member 5 is preferably gentler than a slope of an inclined surface of the recess 2. As shown in FIG. 5, an inclination angle α formed by a line connecting an upper end and a lower end (i.e., a point where the first resin member 4 and the second resin member 5 meet) of the inclined surface (i.e., light reflective surface) of the second resin member 5 and a plane parallel to the bottom surface of the recess 2 is preferably smaller than an inclination angle β formed by a line connecting an upper end and a lower end of the inclined lateral surface of the recess 2 and the bottom surface of the recess 2. With this arrangement, after light emitted from the light emitting element 3 is reflected at the second resin member 5, the reflected light returning to a light emitting element 3 side can be reduced, so that light extraction of the light emitting device can be good.

The second resin member 5 covers at least an upper surface of the first resin member 4. With the second resin member 5 covering the upper surface of the first resin member 4, joining area between the first resin member 4 and the second resin member 5 can be increased, so that separation between each of the resin members can be further prevented.

In the case in which the first resin member 4 is formed by a resin drawing method or by using a mold, a substantially flat surface is provided at a highest portion of the first resin member 4 in a cross-sectional view generally by the weight of the first resin member 4 or by using a jig such as a blade or a mold. In this case, this substantially flat surface is referred to as a "top surface of the first resin member 4". In the case in which a surface of the first resin member 4 has a shape including a curved line or a shape made of a parabolic line, one plane selected from (i) a plane including an vertex and an inflection point of the curved line or the parabolic line, (ii) a plane including a center, a centroid, or an orthocenter of the first resin member 4 in a top view and the inflection point, and (iii) a plane in an upper half of the height of the first resin member 4, can be referred to as the top surface of the first resin member 4.

Figure 6:
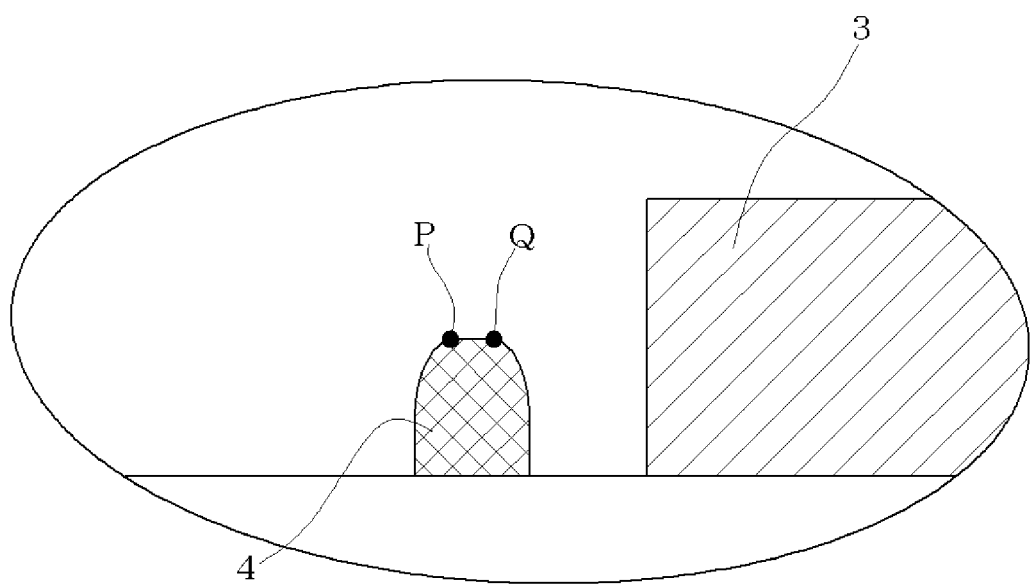
FIG. 6 is a schematic cross-sectional view showing a shape of a first resin member in a light emitting device according to various embodiments of the present disclosure.

An end portion of the second resin member 5 may be at an outer upper end portion P on the first resin member 4, but preferably, a portion of the second resin member 5 is at an inner side of the outer upper end portion P, more preferably at an inner side of an inner upper end portion Q of the first resin member 4. The second resin member 5 is disposed spaced apart from the lateral surfaces of the light emitting element 3. In the present specification, as shown in FIG. 6, of two end portions (i.e., upper end portions) of the top surface of the first resin member 4 that face in a width direction, the outer upper end portion P refers to an end portion that is farther from the light emitting element 3 disposed on the bottom surface of the recess 2 of the package 1, and the inner upper end portion Q refers to the other end portion that is closer to the light emitting element 3 disposed on the bottom surface of the recess 2 of the package 1. In the case in which a portion of the second resin member 5 is located at an inner side of the outer upper end portion P or the inner upper end portion Q, a bonding area between the second resin member 5 and the first resin member 4 is increased, which allows for improving adhesion between the first resin member 4 and the second resin member 5. Thus, separation between these resin members can be prevented.

The first resin member 5 is disposed spaced apart from the lateral surfaces of the light emitting element 3. With this arrangement, the lateral surfaces of the light emitting element 3 are not directly covered by the second resin member 5, so that a light emitting device with good light extraction efficiency can be obtained. Further, an end portion of the second resin member 5 is preferably disposed on a surface of the first resin member 4. As described above, providing a sufficient distance between the second resin member 5 and the lateral surfaces of the light emitting element 3, the second resin member 5 expanded by heat of curing of a resin during manufacturing or by heat generated from the light emitting element 3 can be prevented from contacting any of the lateral surfaces of the light emitting element 3. Further, with the end portion of the second resin member 5 and the surface of the first resin member 4 adhered to each other, the second resin member 5 can be further prevented from touching the lateral surfaces of the light emitting element 3 at the end portion even if the second resin member is expanded.

The light reflective surface of the second resin member 5 has a height that is smallest at an end portion of the second resin member 5 on the light emitting element 3 side. In other words, the light reflective surface has a height from the bottom surface of the recess 2 that is smallest at the end portion of the second resin member 5 on the light emitting element 3 side. With this arrangement, the light reflective surface of the second resin member 5 is inclined upward from the end portion at the first resin member 4 toward the lateral surfaces of the recess 2, so that light emitted from the light emitting element 3 can be efficiently extracted toward the opening of the recess 2.

The second resin member 5 preferably has a reflectance greater than a reflectance of a constituent member of the package 1. More specifically, when the package 1 is a resin package, the second resin member 5 preferably has a reflectance greater than a reflectance of the resin-molded body that is a constituent member of the resin package. For example, the second resin member 5 contains a greater amount of a light reflective substance (e.g., a titanium oxide) than that of a light reflective substance contained in the resin-molded body. In this case, an amount of the light-reflective substance contained in the second resin member 5 is preferably 1.5 times or greater, more preferably 2 times or greater, further more preferably 2.5 times or greater as much as an amount of the light-reflective substance contained in the second resin member 5. For example, the second resin member 5 contains a titanium oxide in an amount of 40% by weight.

The second resin member 5 has a reflectance greater than a reflectance of a plating layer (e.g., an Ag-plating layer) formed on each of the first electrode 6 and the second electrode 7. The term "reflectance" as described above refers to the average of the light reflectances with respect to all wavelengths of light emitted from the light emitting element 3, and the expression "the second resin member 5 has a reflectance greater than a reflectance of a plating layer" refers to that average of the reflectances of the second resin member 5 with respect to all wavelengths of light emitted from the light emitting element 3 is greater than that of the plating layer. In the case in which the second resin member 5 has a reflectance smaller than a reflectance of the plating layer, covering the wire that absorbs light emitted from the light emitting element 3 with the second resin member 5, providing the light reflective surface of the second resin member 5, which is configured to upwardly direct light emitted from the light emitting element 3, to be inclined more upward (i.e., so that the inclination angle $\alpha$<inclination angle $\beta$), or the like allows for increasing light extraction, so that the light emitting device with good light extraction can be obtained.

In the case in which the package 1 is a resin package, a resin of good discoloration resistance, in which discoloration due to light or heat is less easily occur than in the resin-molded body of the package 1, is preferably used for the second resin member 5. Because discoloration may easily occur at a portion directly irradiated with heat or light from the light emitting element 3, it is preferable that, for example, a surface of the resin-molded body made of an epoxy-based resin is preferably covered by the second resin member 5 made of silicone-based resin with greater discoloration resistance than that of the resin-molded body. The second resin member 5 preferably has a high viscosity. For example, a viscosity of the second resin member 5 is preferably in a range of 1 Pa·s to 100 Pa·s, more preferably in a range of 5 Pa·s to 100 Pa·s. With this arrangement, at the time of forming the second resin member 5, the second resin member 5 can be easily spaced apart from the lateral surfaces of the light emitting element 3, so that the second resin member 5 can be prevented from reaching the lateral surfaces of the light emitting element 3.

The second resin member 5 covers at least a portion of each of the lateral surfaces of the recess 2 in a cross-sectional view, and may cover the entirety of each of the lateral surfaces of the recess 2 as shown in FIG. 2C. In other words, the upper end portion of the second resin member 5 may be located at the upper end portion of the lateral surfaces of the recess 2. With this arrangement, the entirety of each of the lateral surfaces of the recess 2 can be covered by the second resin member 5 having a reflectance greater than a reflectance of a member constituting the package, so that a light emitting device with good light extraction efficiency can be obtained.

The second resin member 5 preferably covers an entire region of a bottom surface of the recess 2 except for the element-mounting region X and a portion on which the first resin member 4 is disposed. In particular, the second resin member 5 is preferably arranged so as to embed bonding regions of wires that are connecting electrodes of the light emitting element 3 and the first electrode 6 and the second electrode 7, respectively, or a portion or an entirety of an electronic component such as a protective element. With this arrangement, absorption of light from the light emitting element by the wires or the protective element can be reduced.

For the second resin member, a material that does not easily transmit or absorb light from the light emitting element 3 or light from outside is preferably employed. For example, for a base material of the second resin member, a thermosetting resin, a thermoplastic resin, or the like may be used, and more specific examples of such a resin include a phenol resin, an epoxy resin, a BT resin, a PPA resin, and a silicone resin. Also, in such a resin employed for the base material described above, light scattering particles such as a reflecting member (for example, titanium oxide, zinc oxide, silicon oxide, zirconium oxide, aluminum oxide, aluminum nitride) that hardly absorb light from the light emitting element 3 and have a refractive index greatly different from that of a resin used for the base material may be dispersed, which can efficiently reflect light.

For the second resin member 5, a material with a small light reflectance with respect to light from outside of the light emitting device (e.g., in many cases, sunlight) in order to increase contrast of the light emitting device. In this case, generally, the color of the second resin member 5 is preferably black or a color similar to black. For a filler in such second resin, a carbon such as acetylene black, activated carbon, or graphite, a transition metal oxide such as iron oxide, manganese dioxide, cobalt oxide, or molybdenum oxide, a colored organic pigment or the like, may be used according to the purpose.

4. Singulating Collective Substrate B to Obtain Light Emitting Device

The collective substrate B in which the light emitting elements 3 are disposed is singulated, so that a plurality of light emitting devices 100 are obtained. Various methods can be employed for the singulation, and examples of such methods include cutting with a lead-cut mold or a blade and cutting with a laser beam.

Method of Manufacturing Light Emitting Device According to First Embodiment

In the description below, an example of a method of manufacturing a light emitting device 100 according to a first embodiment in which the package 1 is a resin package is illustrated.

First, a metal plate is etched to form a lead frame including a plurality of first electrodes 6 and a plurality of second electrodes 7. Subsequently, a plating layer made of Ni, Pd, Au, Ag, etc., is formed on a surface of the lead frame. The plating layer may be formed after forming the resin-molded body and before mounting the light emitting elements 3.

Next, the lead frame is clamped by a mold assembly including an upper mold having protrusions and a lower mold having a flat upper surface. Then, a resin containing a light-reflective substance is injected from a resin injection port, and heating at a predetermined temperature and applying a predetermined pressure are performed, so that a resin-molded body is formed on the lead frame. At this time, portions of the lead frame in contact with the protrusions of the upper mold corresponds to recesses 2 of the packages 1, and portions of the lead frames that are not in contact with the protrusions and the upper mold create cavities for forming the resin-molded bodies. Examples of a method of forming a resin-molded body with the mold assembly includes transfer molding method, an injection molding method, and a compression molding method. The lead frame on which the resin-molded body is formed (which is referred to as "lead frame with the resin-molded body" in the description below) includes a plurality of recesses 2 and a plurality of first electrodes 6 and second electrodes 7 disposed on bottom surfaces of the recesses 2.

Then a light emitting element 3 is mounted in an element-mounting region X of the bottom surface of each of the recesses defined by the lead frame with the resin-molded body using a die-bonding agent.

Subsequently, using a resin-drawing method, molten resins to be first resin members 4 may be formed so as to surround the element-mounting regions X. Subsequently, the molten resins are pre-cured, so that the first resin members 4 can be obtained. Examples of conditions of the pre-curing include holding at 100° C. for five minutes. At this time, the top surface of each of the first resin members 4 is formed higher than the element-mounting region X.

Then, using conductive wires, electrodes of each of the light emitting elements 3 are electrically connected to the first electrode 6 and the second electrode 7 on the bottom surface of each of the recesses 2, respectively.

Subsequently, the second resin member 5 is formed between the lateral surfaces of each of the recesses 2 and each of the first resin members 4 so as to cover at least a portion of each of the conductive wires. At this time, the second resin member 5 covers at least a bonding portion of each of the wires, more preferably covers 50% or greater of each of the wires. With this arrangement, absorption of light emitted from the light emitting element 3 by the wires can be reduced. Also, in the case of including an electronic component such as protective elements, the second resin member 5 is preferably arranged so as to cover a part of or to embed the entirety of each of the electronic components such as a protective element. With this arrangement, absorption of light from the light emitting element by the protective element or other members can be reduced.

The second resin member 5 may be formed by a potting method. In the case in which the second resin member 5 is formed by using a potting method, for example, the second resin member can be formed by potting a resin on any one portion (i.e., applied on one portion) of the bottom surface of the recess 2, and naturally flowing the resin. This is preferable because the second resin member 5 can be easily formed. The second resin member 5 may also be formed by potting at corner portions or end portions of each of the recesses 2. For example, in the case in which the bottom surface of each of the recesses 2 has a rectangular shape in a plan view, the second resin member 5 may be arranged by potting on four corners of the bottom surface (i.e., applying on four portions of the bottom surface). With this manner, the second resin member 5 can be securely formed at corners where light is easily attenuated, so that a light emitting device with good light extraction can be manufactured. Potting can be performed any appropriate number of times.

After forming the second resin member 5, the second resin member 5 is cured. The curing of the first resin member 4 and the curing of the second resin member 5 may be performed simultaneously, or may be performed in different steps. For example, the second resin member 5 may be formed in a state in which the first resin member 4 is uncured or incompletely cured, and then the first resin member 4 and the second resin member 5 may be simultaneously cured.

With this manner, formation of interface between the first resin member 4 and the second resin member 5 can be prevented, so that adhesion between these members can be increased.

Subsequently, a light-transmissive sealing member is formed in each of the recesses 2 so as to cover the light emitting element 3. The sealing member preferably contains phosphor particles. For a resin serving as a base material of the sealing member, a resin material that is the same as that used for the first resin member 4 can be used. Examples of the phosphor particles include a yttrium aluminum garnet activated with cerium, a lutetium aluminum garnet activated with cerium, a nitrogen-containing calcium aluminosilicate activated with europium and/or chromium (in which a portion of calcium can be substituted by strontium), a sialon activated with europium, a silicate activated with europium, a strontium aluminate activated with europium, a potassium fluosilicate activated with manganese. Examples of a method for forming the sealing member include a potting method. The sealing member is provided for protecting the light emitting element 3 from an external force, dust, moisture and the like, and to improve the heat resistance, weather resistance, and light resistance of the light emitting element 3.

Then, after these steps, the lead frame with the first resin member, in which the light emitting elements 3 are disposed and the first resin members 4 and the second resin members 5 are formed, is singulated. As a result, individual light emitting devices 100 can be obtained. For the singulation, cutting methods such as dicing can be employed.

The light emitting device 100 after singulation is briefly described below.

The light emitting device 100 includes a package 1 having a recess 2 defined by lateral surfaces and a bottom surface and an element-mounting region X on the bottom surface of the recess 2, a light emitting element 3 mounted on the element-mounting region X, a light-reflective first resin member 4 surrounding the element-mounting region X, and a second resin member 5 having a light reflective surface formed at least between the lateral surfaces of the recess 2 and the first resin member 4.

The second resin member 5 covers at least an upper surface of the first resin member 4. With this arrangement, a bonding area between the first resin member 4 and the second resin member 5 is increased, which can prevent separation between these resin members even if the first resin member 4 and/or the second resin member 5 are expanded by heat generated by the light emitting element 3, so that a light emitting device with high reliability can be obtained.

Further, an end portion of the second resin member 5 is located on a surface of the first resin member 4, which can prevent the second resin member 5 from covering the lateral surfaces of the light emitting element 3, so that a light emitting device with high light extraction efficiency can be obtained.

Method of Manufacturing Light Emitting Device According to Second Embodiment

Next, an example of a method of manufacturing a light emitting device 200 according to a second embodiment in which a package 2 is a resin package is described.

Figure 7:
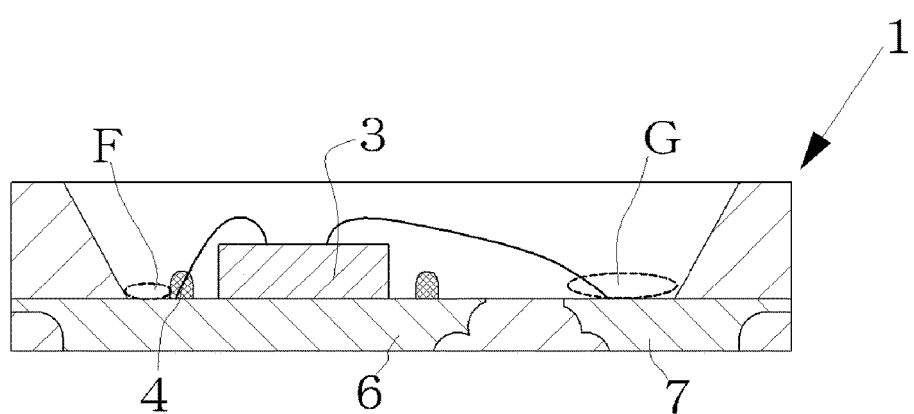
FIG. 7 is a schematic top view showing a light emitting device according to a second embodiment of the present disclosure.

The method of manufacturing the light emitting device 200 is different from the method of manufacturing the light emitting device 100 according to the first embodiment in the order of forming a first resin member 4 and connecting wires, which is described below in detail. FIG. 7 is a schematic top view showing a light emitting device 200 according to the second embodiment.

First, a lead frame with a resin-molded body before forming a first resin member is provided, as in the first embodiment. Then, in an element-mounting region X of a bottom surface of the recess 2, a light emitting element 3 is mounted on a surface of a first electrode 6 or a second electrode 7 using a die-bonding material. For example, when the package 1 having an approximately quadrangular outer shape is viewed from above, the light emitting element 3 is located offset from the center of the package 1 and located on an electrode side on which the light emitting element 3 is disposed.

Subsequently, an electrode of the light emitting elements 3 (e.g., n-electrode) and a surface of the first electrode 6 or the second electrode 7 on which the light emitting element 3 is disposed is electrically connected via a first wire. In FIG. 7, the light emitting element 3 is disposed on the first electrode 6, and the first wire and the first electrode 6 are electrically connected.

Subsequently, the first resin member 4 is formed so as to cover a bonding portion of the first wire and surround the light emitting element 3. With the bonding portion of the first wire covered by the first resin member 4, the bonding strength of the wire can be increased, and ratio of light emitted from the light emitting element 3 and then absorbed by the wire can reduced. Further, with this arrangement, on an upper surface of the first electrode 6, the bonding portion of the first wire can be located on a region where the first resin member is to be formed even in the case in which the distance between the first resin member 4 and lateral walls of the resin-molded body is too small to secure sufficient area for the wire-bonding region F to be bonded to the first wire, so that miniaturization of the light emitting device can be achieved. In FIG. 7, on the upper surface of the second electrode 7, the first resin member 4 is not formed in a wire-bonding region G to be bonded to the second wire. However, in the case in which the first resin member 4 is also formed on an upper surface of the second electrode 7, the bonding portion of the second wire may be covered by the first resin member 4

In this case, as in the first embodiment, a resin drawing method may be employed for the forming of the first resin member 4.

Subsequently, an electrode of the light emitting elements 3 (e.g., p-electrode) and a surface of the first electrode 6 or the second electrode 7 on which the light emitting element 3 is not disposed are electrically connected via a second wire. In FIG. 7, the second wire and the second electrode 7 are electrically connected. The first wire has a length different from that of the second wire, and in FIG. 7, the second wire has a length greater than a length of the first wire. Through the steps as described above, even in the case in which the electrode surface of either the first electrode 6 or the second electrode 7 has a small wire-bonding region, covering the small wire-bonding portion of the surface of the electrode by the first resin member allows for preventing increase in size of the light emitting device, so that a small-type light emitting device can be obtained.

Method of Manufacturing Light Emitting Device According to Third Embodiment

Figure 8:
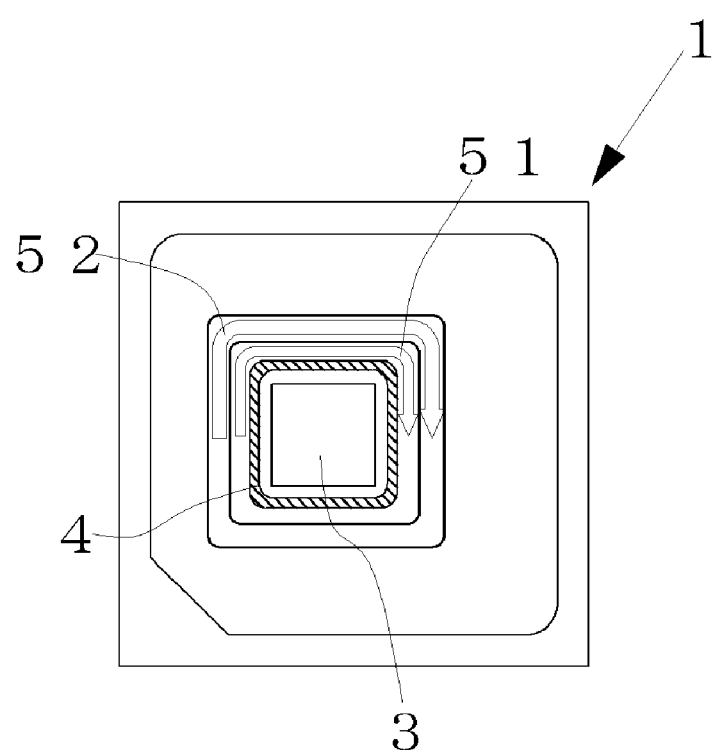
FIG. 8 is a schematic top view showing a light emitting device according to a third embodiment of the present disclosure.

Next, an example of a method of manufacturing a light emitting device 300 according to a third embodiment in which a package 1 is a resin package is described in detail. The method of manufacturing the light emitting device 300 is different from the method of manufacturing the light emitting device 100 according to the first embodiment in the forming of a first resin member 5, which is described below in detail. FIG. 8 is a schematic top view showing a light emitting device 300 according to the third embodiment.

First, a lead frame with a plurality of resin molded bodies each including a recess, a first electrode 6, and a second electrode 2 each disposed on a bottom surface of a recess 2 is provided, as in the first embodiment.

A light emitting element 3 is disposed in an element-mounting region X in each recess 2, and a first resin member 4 is disposed to surround the element-mounting region X.

Subsequently, second resin members 5 are disposed surrounding the first resin members 4, respectively, by using a resin drawing method so that each of the second resin members 5 is formed with a plurality of frame-shaped portions surrounding the first resin member 4. The plurality of resin frame-shaped portions is layered on the bottom surface of each of the recesses 2. More specifically, as illustrated on FIG. 8, a first resin frame-shaped portion 51 is disposed to be in contact with the first resin member 4. Then, between the first resin frame-shaped portion 51 and lateral surfaces of the recess 2, a second resin frame-shaped portion 52 is disposed to be in contact with the first resin frame-shaped portion 51. By repeating the above a plurality of times, a first layer of the plurality of resin frame-shaped portions is disposed between the first resin member 4 and the lateral surfaces of the recess 2, in contact with each other and also in contact with the first resin member 4 and the lateral surfaces of the recess 2. Subsequently, a second layer of the plurality of resin frame-shaped portions is similarly disposed on the first layer. A third layer, and so on, may be disposed in a similar manner. With this, the second resin member 5 having a layered structure made of layers of a plurality of resin frame-shaped portions can be formed. The number of the resin frame-shaped portions in each layer, or the number of the layers can be appropriately adjusted. In the above manner, the resin frame-shaped portions can be formed with a substantially uniform amount of the resin, so that exchanging of syringes or the like in a device performing the resin-drawing can be omitted and manufacturing can be performed in a simple process.

Further, besides layering a plurality of resin frame-shaped portions, the second resin member 5 can be formed by increasing the height of each of the resin frame-shaped portion from a first resin member 4 side toward the lateral surfaces of the recess 2 by adjusting the amount of a resin of each of the resin frame-shaped portions.

The method of manufacturing the light emitting device 300 according to the third embodiment is not limited to the description in the third embodiment, and can be changed as appropriate within the scope of the invention. For example, some configurations in each embodiment may be variously combined.

In each of the above-described embodiments, a protective layer made of an insulating material such as silicon dioxide may be disposed on the first electrode 6 and/or the second electrode 7. With this arrangement, in the case in which a silver-plating layer is formed on the first electrode 6 and/or the second electrode 7, discoloration of the silver-plating layer caused by sulfur component in the air can be reduced. The protective layer can be formed using, for example, a vacuum process such as a sputtering.

The protective layer may be formed after the forming of the first resin member 4 and before the forming of the second resin member 5, which are performed after the light emitting element 3 is mounted and connected using the wires. Otherwise, the protective layer may be partially formed on an exposed portions of the recess 2 before the forming of the first resin member 4 or after the forming of the second resin member 5.

In each of above-described embodiments, the first resin member 4 may have any appropriate shape, and examples thereof include a quadrangular shape, a polygonal shape, a circular shape, an elliptical shape, and combination of these shapes in a plan view.

In the case in which the first resin member 4 has a circular peripheral shape in a plan view, the second resin member 5 formed to surround the first resin member 4 has a circular inner shape in a plan view. With the second resin member 5 not having corner portions in a plan view as described above, light components emitted from the light emitting element 3 can be prevented from being attenuated at the corner portions. Accordingly, a light emitting device with high light extraction efficiency can be obtained. Also, in a plan view, the light emitting element 3 in this case preferably has a shape closer to a circular shape such as a hexagonal shape corresponding to the circular shape of the first resin member 4. With the light emitting element 3 having such a shape, the light emitting element having a relatively large size with respect to the area of the element-mounting region X can be used, so that light extraction efficiency can be improved.

Figure 9A:
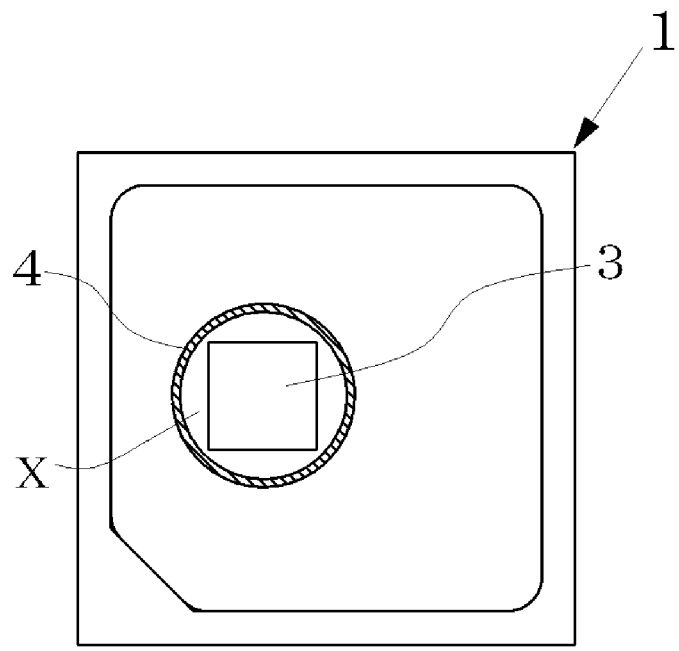
FIG. 9A is a schematic top view showing a shape of a first resin member in a light emitting device according to one embodiment of the present disclosure.
Figure 9B:
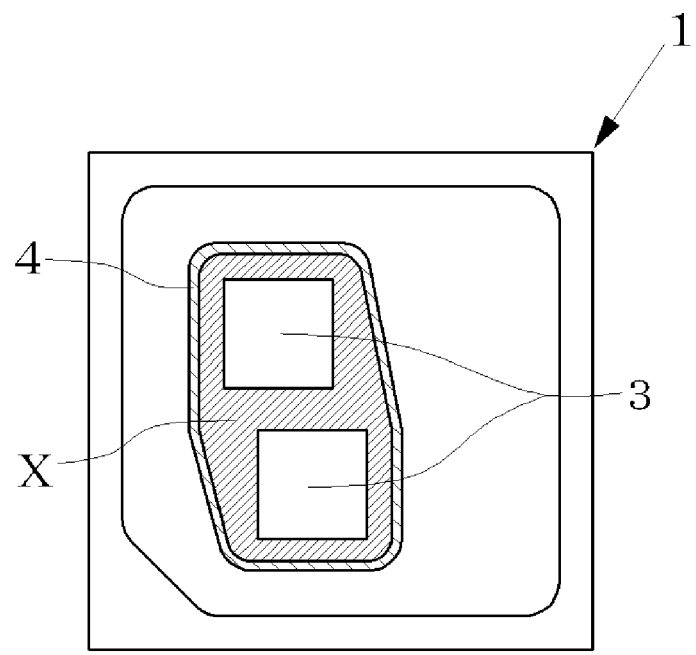
FIG. 9B is a schematic top view showing a shape of a first resin member in a light emitting device according to one embodiment of the present disclosure.

In each of above-described embodiments, the first resin member 4 or the element-mounting region X may have an asymmetric shape in a plan view as shown in FIG. 9B. With such a shape, distribution of number of phosphors disposed in the element-mounting region except for below the light emitting element 3 is varied in accordance with directions, so that color temperature of light can be easily controlled according to light distribution.

Further, as shown in FIG. 9B, in the case in which a plurality of light emitting elements 3 are mounted in the element-mounting region X, the light emitting elements 3 are preferably disposed offset from each other in an up/down direction or a right/left direction in a plan view. With this arrangement, absorption of light emitted in a direction toward lateral surfaces of the light emitting element 3 from one light emitting element 3 by adjacent light emitting element 3 can be reduced. The offset in this arrangement (i.e., a planar distance between a lateral surface of one light emitting elements 3 and a lateral surface of adjacent light emitting element 3 on the same side) is, provided that a length of a long side of the light emitting element 3 in a plan view is represented by L, preferably greater than L/10, more preferably L/3, even more preferably L or greater.

Figure 9C:
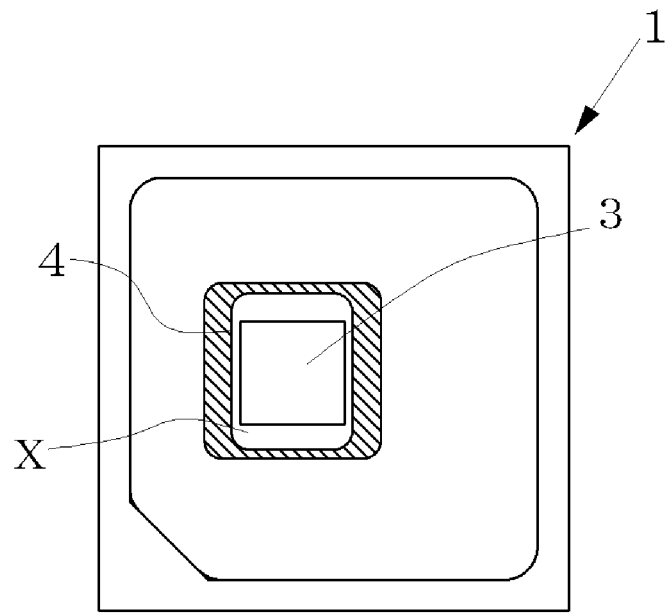
FIG. 9C is a schematic top view showing a shape of a first resin member in a light emitting device according to one embodiment of the present disclosure.

In each of above-described embodiments, the first resin member 4 may have varied widths in a plan view as shown in FIG. 9C. In other words, a portion of the first resin member 4 may have a width greater than that of other portions of the first resin member 4. With such a shape, distribution in number of phosphors disposed on the first resin member 4 can be varied, so that light distribution can be controlled so as to, for example, increase color temperature of light in an intended direction. In this case, the first resin member 4 preferably has the maximum width of 1.5 times as large as the minimum width thereof or greater. In FIG. 9C, in a plan view, the first resin member 4 has the maximum width at a portion extending in a right/left direction, and has the minimum width at a portion extending in a up/down direction.

Figure 9D:
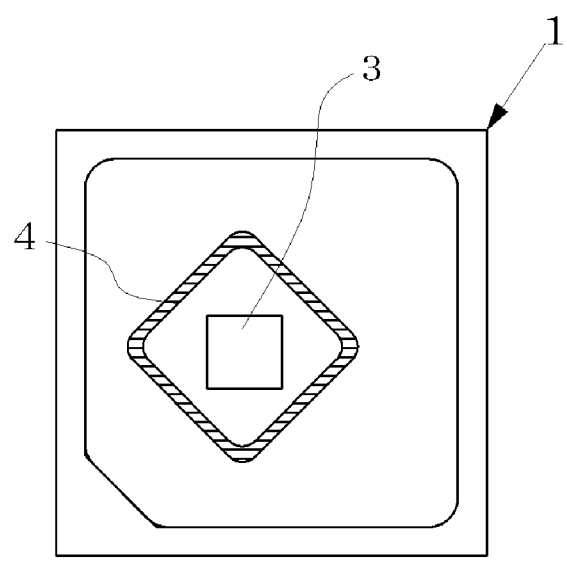
FIG. 9D is a schematic top view showing a shape of a first resin member in a light emitting device according to one embodiment of the present disclosure.

Also, as shown in FIG. 9D, distances between lateral surfaces and the first resin member 4 may not be uniform, and may be varied. The first resin member 4 shown in FIG. 9D has substantially a rhombic shape in a top view. With this shape, a distance between the light emitting element 3 and the second resin member 5 may be increased or decreased in any appropriate direction, so that light distribution of the light emitting device itself can be appropriately controlled.

In each of above-described embodiments, grooves may be formed in the bottom surface of the recess 2 of the package 1 to surround the element-mounting region X, and the first resin member 4 may be disposed in the grooves. With this arrangement, even in the case of forming the first resin member 4 having a narrow width, a joining area between the first resin member 4 and the package 1 can be increased, so that adhesion between the first resin member 4 and the package 1 can be increased. Further, in the case of forming the first resin member 4 in a resin drawing method, locations or regions to dispose the first resin members 4 can be recognized by the grooves, thus, the grooves can serve as alignment guides. In this case, the first resin members 4 are formed higher than the element-mounting region X. With this arrangement, the second resin member 5 can be stopped by the first resin member 4 in each of the recesses 2, so that the second resin member 5 can be prevented from reaching the lateral surfaces of the light emitting element 3.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A method of manufacturing a plurality of light emitting devices, the method comprising:
    providing a collective substrate including a plurality of packages, each of the packages including:
        a recess defined by lateral surfaces and a bottom surface,
        a first electrode and a second electrode that are disposed at the bottom surface of the recess, and
        a light-reflective first resin member located on the bottom surface of the recess and surrounding an element-mounting region of the bottom surface of the recess, the first resin member having an upper surface located at a position higher than the element-mounting region;
    mounting a light emitting element in the element-mounting region;
    forming a light-reflective second resin member having a light reflective upper surface,
        wherein the second resin member is disposed at least between the lateral surfaces of the recess and the first resin member,
        wherein the second resin member covers at least a portion of an upper surface of the first resin member and is spaced apart from lateral surfaces of the light emitting element, and
        wherein a height from the bottom surface of the recess to the light reflective upper surface of the second resin member is smallest at an inner end portion of the light reflective upper surface that is located at the first resin member; and
    singulating the collective substrate to obtain the plurality of light emitting devices.

2. The method of manufacturing a light emitting device according to claim 1, wherein a top of the first resin member is located lower than an active layer of the light emitting element.

3. The method of manufacturing a light emitting device according to claim 1, further comprising:
    curing the first resin member and curing the second resin member,
    wherein, a viscosity of the first resin member before the curing of the first resin member is greater than a viscosity of the second resin member before the curing of the second resin member.

4. The method of manufacturing a light emitting device according to claim 1, wherein the first resin member is formed using a resin drawing method.

5. The method of manufacturing a light emitting device according to claim 4, wherein the light emitting element is electrically connected to the first electrode and the second electrode by connecting the first electrode and the light emitting element via a first wire, disposing the first resin member so as to cover a bonding region of the first electrode and the first wire, and connecting the second electrode and the light emitting element via a second wire.

6. The method of manufacturing a light emitting device according to claim 1, wherein the second resin member includes a plurality of resin frame-shaped portions, and the plurality of resin frame-shaped portions are layered in a height direction.

7. The method of manufacturing a light emitting device according to claim 1, wherein the first resin member is formed using a mold assembly.

8. The method of manufacturing a light emitting device according to claim 1, wherein:
    each of the plurality of packages includes a resin-molded body and an electrode portion including a plurality of electrodes, and
    each electrode portion is formed with each respective resin-molded body as a single body.

9. The method of manufacturing a light emitting device according to claim 1, further comprising forming a light-transmissive sealing member in the recess so as to cover the light emitting element and the light reflective upper surface of the light-reflective second resin member.

10. A light emitting device comprising:
    a package including:
        a recess defined by lateral surfaces and a bottom surface, and
        an electrode portion including a plurality of electrodes arranged at a bottom surface of the recess, the bottom surface of the recess including an element-mounting region;
    a light emitting element mounted in the element-mounting region;
    a light-reflective first resin member having an upper surface located at a position higher than the element-mounting region;
    a light-reflective second resin member having a light reflective upper surface,
    wherein the second resin member is disposed at least between the lateral surfaces of the recess and the first resin member,
    wherein the second resin member covers at least a portion of an upper surface of the first resin member and is spaced apart from lateral surfaces of the light emitting element, and
    wherein a height from the bottom surface of the recess to the light reflective upper surface of the second resin member is smallest at an inner end portion of the light reflective upper surface that is located at the first resin member.

11. The light emitting device according to claim 10, wherein a top of the first resin member is located lower than an active layer of the light emitting element.

12. The light emitting device according to claim 10, further comprising a light-transmissive sealing member located in the recess and covering the light emitting element and the light reflective upper surface of the light-reflective second resin member.

\* \* \* \* \*